(12) United States Patent
Mor et al.

(10) Patent No.: US 8,865,560 B2
(45) Date of Patent: Oct. 21, 2014

(54) FINFET DESIGN WITH LDD EXTENSIONS

(75) Inventors: Yi-Shien Mor, Hsin-Chu (TW); Hsiao-Chu Chen, Caotun Township (TW); Mu-Chi Chiang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 33 days.

(21) Appl. No.: 13/411,351

(22) Filed: Mar. 2, 2012

(65) Prior Publication Data

US 2013/0228876 A1  Sep. 5, 2013

(51) Int. Cl.
*H01L 21/336* (2006.01)

(52) U.S. Cl.
USPC .... 438/400; 438/478; 257/401; 257/E29.255; 257/E21.409; 257/E21.54

(58) Field of Classification Search
CPC ............ H01L 27/0886; H01L 27/1211; H01L 27/0924; H01L 29/423; H01L 21/845
USPC .................. 438/151, 154, 400, 163, 707, 478
See application file for complete search history.

(56) References Cited

U.S. PATENT DOCUMENTS

| | | | | |
|---|---|---|---|---|
| 7,687,361 | B2 * | 3/2010 | Jang et al. | 438/294 |
| 7,723,797 | B2 | 5/2010 | Kim et al. | |
| 7,871,872 | B2 * | 1/2011 | Kim et al. | 438/163 |
| 2004/0150029 | A1 * | 8/2004 | Lee | 257/308 |
| 2005/0145944 | A1 * | 7/2005 | Murthy et al. | 257/351 |
| 2005/0208715 | A1 * | 9/2005 | Seo et al. | 438/197 |
| 2008/0001176 | A1 * | 1/2008 | Gopalakrishnan et al. | 257/211 |
| 2008/0145981 | A1 * | 6/2008 | Kim et al. | 438/163 |
| 2008/0157130 | A1 * | 7/2008 | Chang | 257/288 |
| 2008/0237796 | A1 * | 10/2008 | Doyle et al. | 257/534 |
| 2009/0280618 | A1 * | 11/2009 | Ali et al. | 438/424 |
| 2010/0081240 | A1 * | 4/2010 | Yagishita | 438/151 |

FOREIGN PATENT DOCUMENTS

| | | |
|---|---|---|
| JP | 2009-060104 | 3/2009 |
| KR | 2009031525 A | 3/2009 |
| KR | 10-2010-0073516 | 7/2010 |
| WO | 2008005612 A1 | 1/2008 |

* cited by examiner

*Primary Examiner* — Daniel Luke
*Assistant Examiner* — Pavel Ivanov
(74) *Attorney, Agent, or Firm* — Slater & Matsil, L.L.P.

(57) ABSTRACT

System and method for forming lightly doped drain (LDD) extensions. An embodiment comprises forming a gate electrode on a semiconductor fin and forming a dielectric layer over the gate electrode. The gate electrode is then etched to expose a portion of the semiconductor fin. The exposed portions of the fin comprise the LDD extensions.

19 Claims, 12 Drawing Sheets

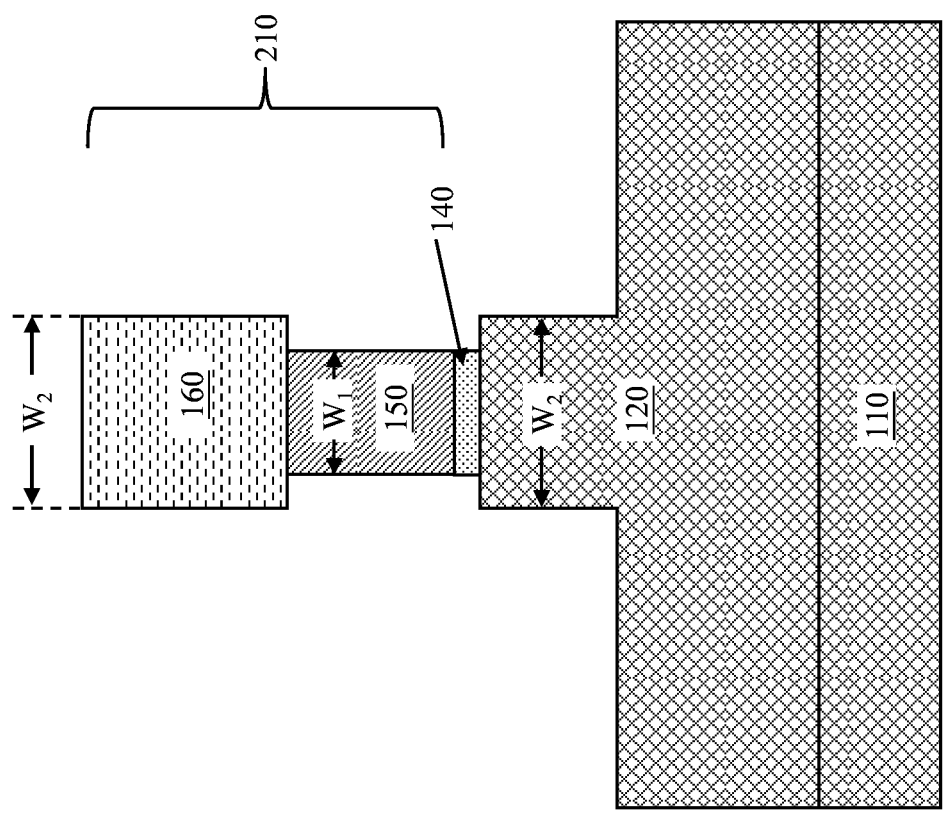

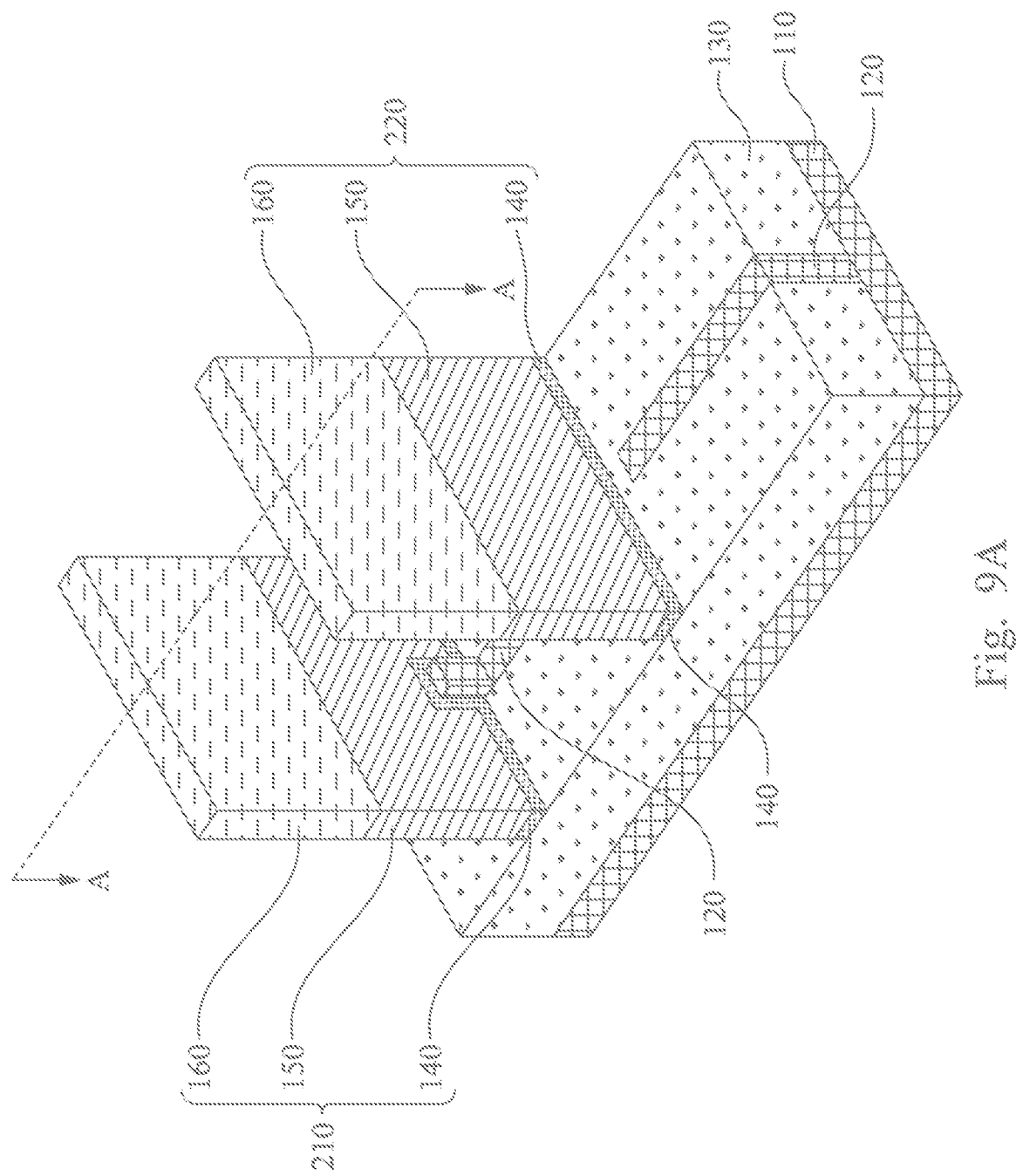

us 8,865,560 B2

FINFET DESIGN WITH LDD EXTENSIONS

BACKGROUND

With the increasing down-scaling of integrated circuits and increasingly demanding requirements to the speed of integrated circuits, transistors need to have higher drive currents with smaller dimensions. Fin field-effect transistors (FinFET) were thus developed. FinFET transistors have increased channel widths. Since the drive currents of transistors are proportional to the channel widths, the drive currents of FinFETs are increased.

To maximize the channel width of a FinFET, the FinFET may include multiple fins, with the ends of the fins connected to a same source and a same drain. The formation of multi-fin FinFET may include forming a plurality of fins parallel to each other, forming a gate stack on the plurality of fins, and interconnecting the ends of the plurality of fins to form a source region and a drain region. The forming of the gate stack may include depositing layers of material on the fins and patterning the deposited layers to form the gate stack.

Several multi-fin FinFETs may be formed next to each other on a substrate which may include a dummy gate stack between FinFETs to aid in certain processing steps. However, the dummy gate stack can present difficulties when patterning the material between the dummy gate stack and the surrounding fins.

Accordingly, what is needed in the art is a semiconductor device that may incorporate FinFETs thereof to take advantage of the benefits with increased drive currents without increasing the chip area usage while at the same time overcoming the deficiencies of the prior art.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 9A and 9B illustrate perspective and cross-sectional views of a FinFET in accordance with another embodiment.

DETAILED DESCRIPTION OF ILLUSTRATIVE EMBODIMENTS

Figure 1:
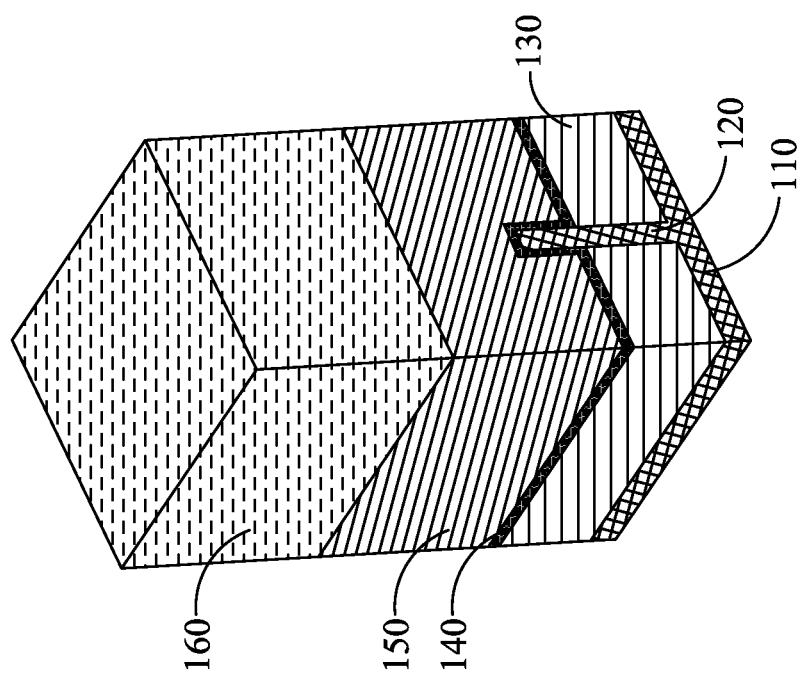
FIGS. 1 through 7 illustrate perspective and cross-sectional views of intermediate stages in the formation of a FinFET in accordance with an embodiment.

This disclosure provides a method of a forming fin field-effect transistor (FinFET) comprising multiple semiconductor fins. The intermediate stages in the manufacturing of an embodiment are illustrated. The variations of the embodiment are then discussed. Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1-7 illustrate intermediate stages of forming a FinFET device in accordance with an embodiment. Referring to FIG. 1, a perspective view of a semiconductor substrate 110, a fin 120, an isolation structure 130, a gate dielectric layer 140, a gate electrode layer 150, and a hard mask 160. Only one fin 120 is shown for clarity. In practice, several fins may be formed simultaneously, as discussed further below. The semiconductor substrate 110 may comprise bulk silicon, doped or undoped, or an active layer of a silicon-on-insulator (SOI) substrate. Other substrates that may be used include multi-layered substrates, gradient substrates, or hybrid orientation substrates.

The fin 120 may be formed of a semiconductor material same as, or a semiconductor material different from the semiconductor substrate 110. In an embodiment, the fin 120 is formed of substantially pure silicon. In alternative embodiments, the fin 120 may comprise silicon germanium (SiGe), silicon carbon (SiC), or the like. In an embodiment, the fin 120 may be epitaxially grown from a top surface of semiconductor substrate 110 within an opening in isolation structure 130. The formation methods of the fin 120 may include atomic layer deposition (ALD), chemical vapor deposition (CVD), such as a reduced pressure CVD (RPCVD), metalorganic chemical vapor deposition (MOCVD), or other applicable methods. The fin 120 may be doped either through an implantation method, or else by in-situ doping as the material is grown. In another embodiment, the fin 120 is formed by patterning a semiconductor layer (not shown) atop the semiconductor substrate 110, or by patterning the semiconductor substrate 110. The fin patterning process may be accomplished by depositing a commonly used mask material (not shown) such as photoresist or silicon oxide over the semiconductor layer (not shown). The mask material is then patterned and the semiconductor layer is etched in accordance with the pattern. In this manner, a semiconductor structure of a semiconductor fin overlying a substrate may be formed.

The isolation structure 130 is over the semiconductor substrate 110 and at least partially on both sides of the fin 120. Isolation structure 130 is also referred to as shallow trench isolation (STI) in some applications, also known as a gap fill oxide in some applications. The isolation structure 130 may be deposited using CVD, sputtering, or any other acceptable methods for depositing isolative materials. The isolation structure 130 may comprise an insulating material such as silicon dioxide, silicon nitride, other insulating materials, or multiple layers or combinations thereof, as examples.

The gate dielectric layer 140 is on top of the isolation structure 130 and fin 120. The gate dielectric layer 140 may be formed by thermal oxidation, CVD, sputtering, or any other acceptable methods for forming a gate dielectric. In some embodiments, the gate dielectric layer 140 includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, and the like, and combinations and multi-layers thereof. In an embodiment, the gate dielectric layer 140 may have a capping layer from metal nitride materials such as titanium nitride, tantalum nitride, or molybdenum nitride with a thickness from about 1 nm to about 20 nm.

After the gate dielectric layer 140 is formed, the gate electrode layer 150 may be formed. The gate electrode layer 150 comprises a conductive material and may be selected from a group comprising polycrystalline-silicon (poly-Si), polycrystalline silicon-germanium (poly-SiGe), metallic nitrides, metallic silicides, and metals. Examples of metallic nitrides include tungsten nitride, molybdenum nitride, titanium nitride, and tantalum nitride, or their combinations. Examples of metallic silicides include tungsten silicide, titanium silicide, cobalt silicide, nickel silicide, platinum silicide, erbium silicide, or their combinations. Examples of metals include tungsten, titanium, aluminum, copper, molybdenum, nickel, platinum, etc.

The gate electrode layer 150 may be deposited by CVD, sputter deposition, or other acceptable techniques for depositing conductive materials. The thickness of the gate electrode layer 150 may be in the range of about 300 angstroms to about 1,000 angstroms. The top surface of the gate electrode layer 150 usually has a non-planar top surface, and may be planarized prior to patterning of the gate electrode layer 150 or gate etch. Ions may or may not be introduced into the gate electrode layer 150 at this point. Ions may be introduced, for example, by ion implantation techniques.

After the gate electrode layer 150 is formed, a hard mask layer 160 may be formed. The hard mask 160 is a protective layer to prevent the underlying structures, such as the gate electrode layer 150, from being removed during an etching process. In an embodiment, the hard mask 160 may comprise a single silicon nitride layer. In another embodiment, the hard mask 160 comprises an oxide layer, such as a silicon oxide layer, and an overlying nitride layer, such as a silicon nitride ($Si_3N_4$) layer. The oxide layer may be formed by any oxidation process, such as wet or dry thermal oxidation in an ambient comprising an oxide, $H_2O$, NO, or a combination thereof, or by CVD techniques. One of ordinary skill in the art will appreciate that other mask materials and/or structures may be used to form hard mask 160. For example, other materials, a single layer, three or more layers, or the like may be used.

Figure 2:
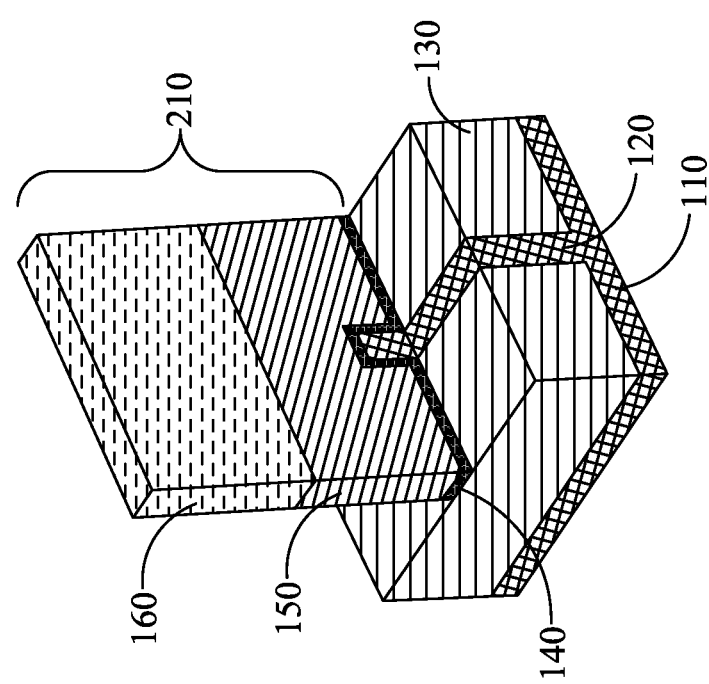

Referring to FIG. 2, the formation of a gate structure 210 is illustrated. The gate structure 210 may be formed by patterning the hard mask 160, the gate electrode layer 150, the gate dielectric layer 140, and the portion of fin 120 extending above the isolation structure 130 using, for example, photolithography techniques known in the art. The hard mask 160, the gate electrode layer 150, the gate dielectric layer 140, and the portion of the fin 120 extending above the isolation structure 130 may be etched using plasma etching to form the patterned gate structure 210 as illustrated in FIG. 2. In an embodiment, the width $W_2$ (see FIGS. 3B and 4B) of the gate structure 210 may be between about 7 nm and about 1400 nm, the length of the gate structure 210 may be between about 7 nm and about 1400 nm, and the height of the gate structure 210 may be between about 100 nm and about 200 nm.

Figure 3A:
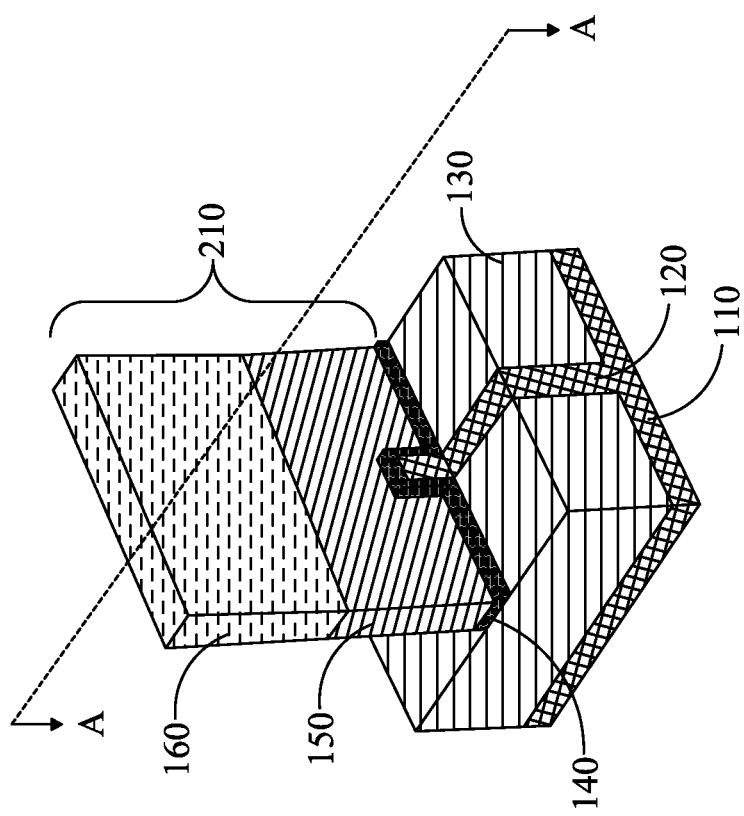
Figure 3B:
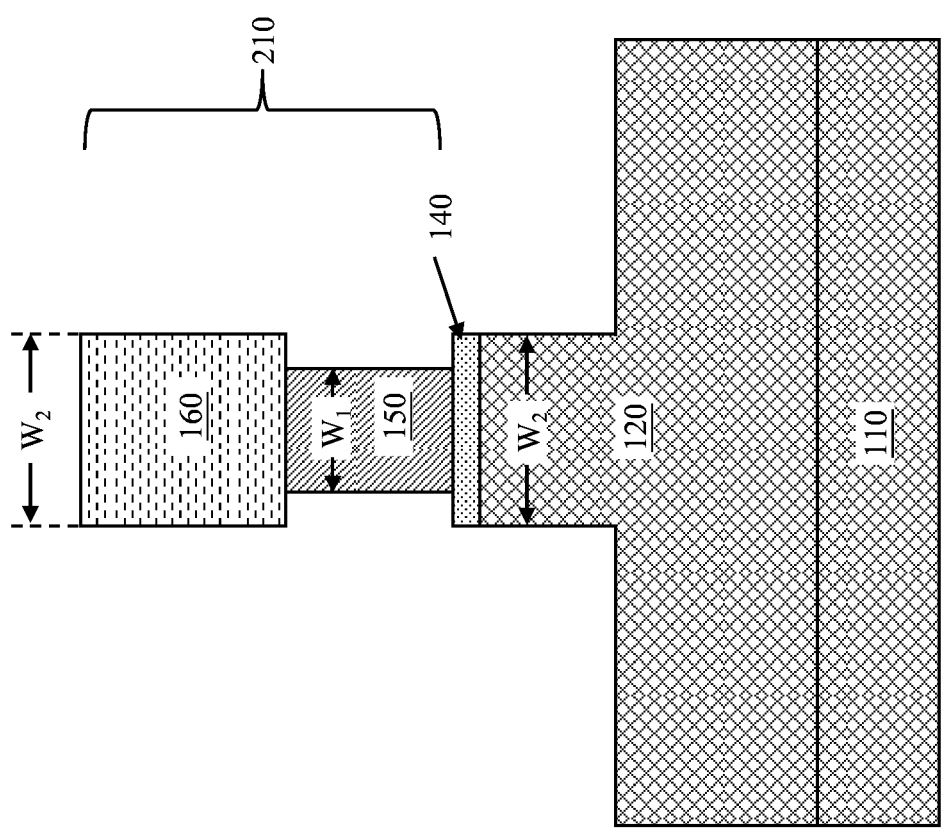

FIG. 3A illustrates a perspective view of a portion of the gate electrode layer 150 sidewalls being removed. FIG. 3B illustrates a cross-sectional view of the FinFET device of FIG. 3A along the A-A line. The portion of the gate electrode 150 sidewalls may be removed using acceptable wet or dry etch techniques, such as by an anisotropic horizontal etch. In an embodiment, the etchant gas may contain $CF_4$, $CHF_3$, Ar, He, $Cl_2$, HBr, $O_2$, combinations of these, or the like at a flow rate between about 30 standard cubic centimeters per minute (sccm) and about 150 sccm. The etch process may be performed at a pressure between about 3 milliTorr and about 10 milliTorr, at a power between about 150 Watts and 600 Watts, and at a temperature between about 30° C. and 80° C. In an embodiment, the exposed portions of the fin 120 may be protected by a mask (not shown) during the etch process. The removal of material from the sidewalls of the gate electrode layer 150 will decrease the overall width of the gate electrode layer 150. In some embodiments, the width $W_1$ (see FIG. 3B) of the gate electrode after the portion is removed may be between about 7 nm and about 36 nm. In an embodiment, the width of material removed from each side of gate electrode 150 may range from about 3 nm to about 15 nm. In an alternative embodiment, only material from one sidewall of the gate electrode may be removed, leaving the other sidewall of the gate electrode substantially aligned with the respective sidewall of the hard mask 160. In some embodiments, the width of material removed from gate electrode 150 may be between about 20% and about 40% of the gate width prior to removal. Stated another way, the width $W_1$ may be between about 60% and about 80% of the width $W_2$ (see FIGS. 3B and 4B).

Figure 4A:
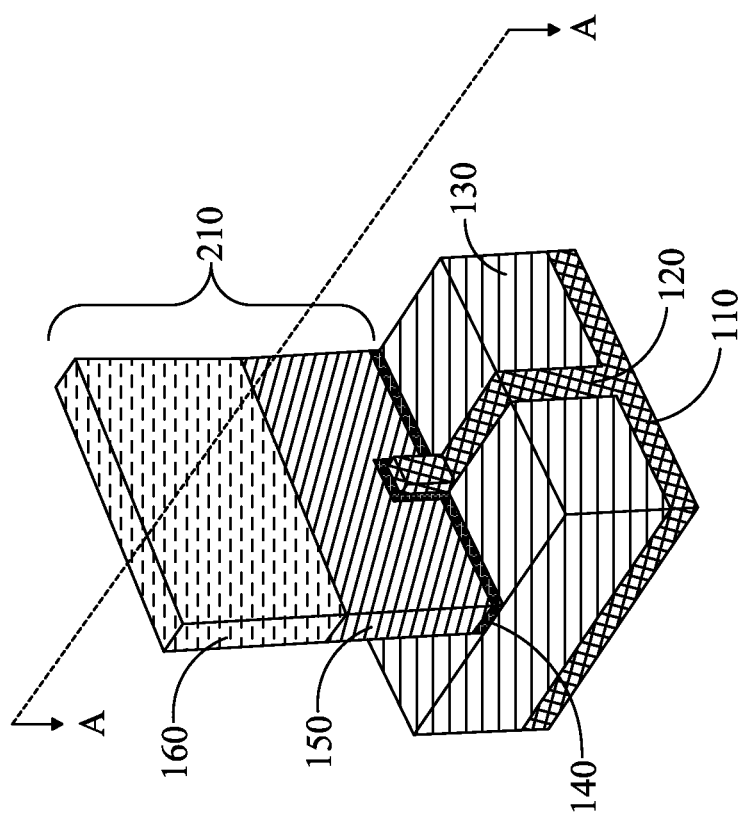

FIG. 4A illustrates a perspective view of a portion of the gate dielectric layer 140 being removed. FIG. 4B illustrates a cross-sectional view of the FinFET device of FIG. 4A along the A-A line. The portion of the gate dielectric layer 140 being removed may be approximately the portion that was exposed due to the removal of a portion of the gate electrode 150 above. The portion of the gate dielectric 140 may be removed using acceptable wet or dry etch techniques, such as by an anisotropic etch. In an embodiment, the etchant gas may contain $BCl_3$, Ar, He, $Cl_2$, or the like at a flow rate between about 30 sccm and about 200 sccm. The etch process may be performed at a pressure between about 3 milliTorr and about 20 milliTorr, at a power between about 300 Watts and 800 Watts, and at a temperature between about 30° C. and 80° C. The exposed portions of the fin 120 and/or the gate electrode 150 may be protected by a mask (not shown) during the etch process. In an embodiment, the width of the gate dielectric layer 140 may be approximately the width $W_2$ before the etch process and approximately the width $W_1$ after the etch process (see FIGS. 3B and 4B).

After portions of the gate electrode 150 and the gate dielectric are removed, the fin 120 may extend outside the gate structure 210 on both sides. In an embodiment, the fin 120 may extend outside the gate structure 210 between about 3 nm to about 15 nm on each side. The fin 120 that extends outside of the gate structure 210 may perform as a lightly doped drain (LDD) extension. LDD extensions may reduce the electric field near the channel region of a transistor, which may reduce the short channel effects (SCEs) of the transistor. For example, SCEs caused by an increased electric field near the channel region are charge injection, substrate current, and electron injection into the gate oxide. The SCEs may be improved by the implementation of LDD extensions.

Figure 5:
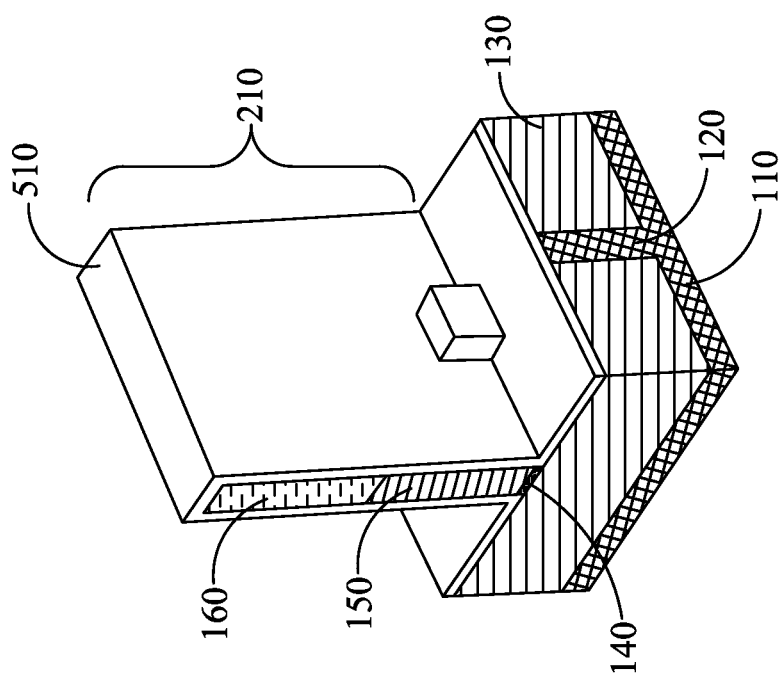

FIG. 5 illustrates the formation of a sealing layer 510. The sealing layer 510 may be formed on the top and sidewalls of the gate structure 210, the top and sidewalls of the exposed portions of the fin 120, and the top of the exposed portions of the isolation structure by thermal oxidation, CVD, sputtering, or any acceptable methods for forming a sealing layer. In an embodiment, the sealing layer 510 may comprise silicon nitride, the like, or a combination thereof.

Figure 6:
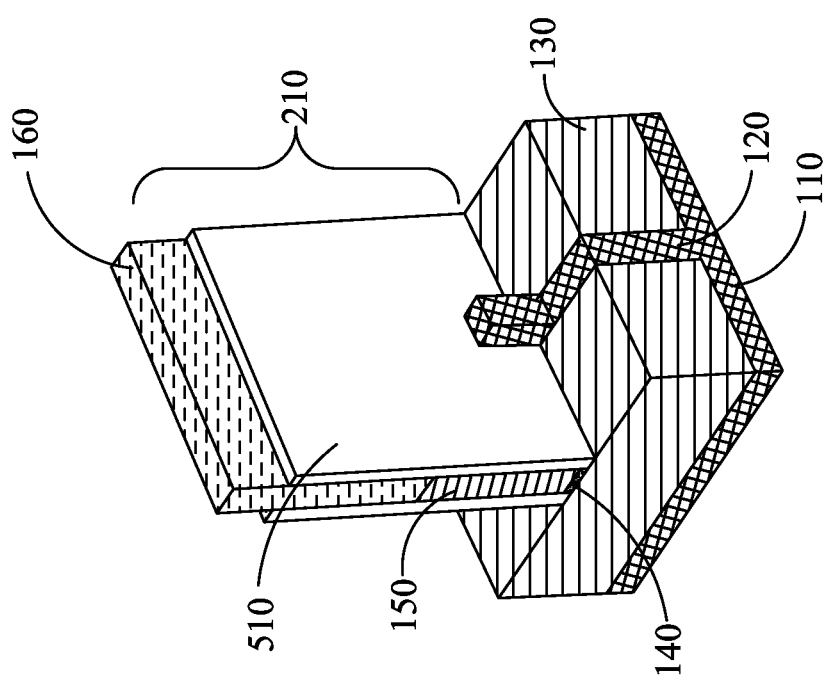

FIG. 6 illustrates the removal of a top portion of the sealing layer 510. The sealing layer 510 may be patterned to remove the sealing layer 510 from the top surface of the gate structure 210 and portions of the sidewalls of the gate structure 210. The sealing layer 510 may be removed using acceptable etch techniques, such as by an anisotropic etch.

Figure 7:
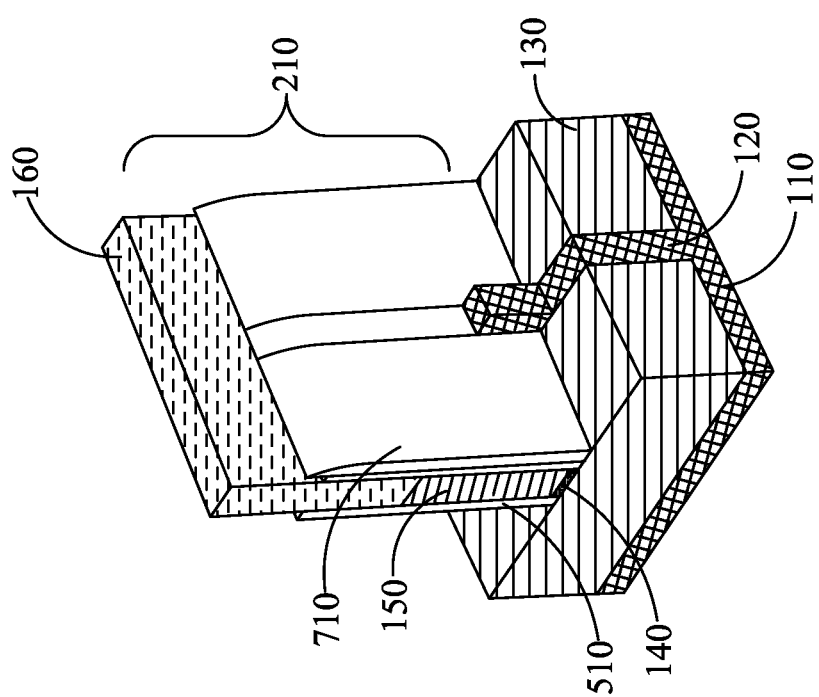

FIG. 7 illustrates the formation of the gate spacers 710. The gate spacers 710 may be formed on opposite sides of the gate structure 210. The gate spacers 710 are typically formed by blanket depositing a spacer layer (not shown) on the previously formed structure. The spacer layer may comprise silicon carbon nitride, the like, or a combination thereof, and may be formed by methods utilized to form such a layer, such as chemical vapor deposition (CVD), plasma enhanced CVD, sputter, and other acceptable methods. The gate spacers 710 are then patterned, for example by anisotropically etching to remove the spacer layer from the horizontal surfaces of the structure. In an embodiment, the gate spacers 710 are formed so as to impart a strain on the channel region of the fin 120. As an example, the fin 120 may comprise silicon, the gate spacers 710 may then be formed through a selective epitaxial growth (SEG) process with a material, such as silicon germanium, silicon carbon nitride, or the like that has a different lattice constant than the silicon. The lattice mismatch between the stressor material in the gate spacers 710 and the channel region of the fin 120 will impart a stress into the channel region of the fin 120 that will increase the carrier mobility and the overall performance of the device.

Figure 8:
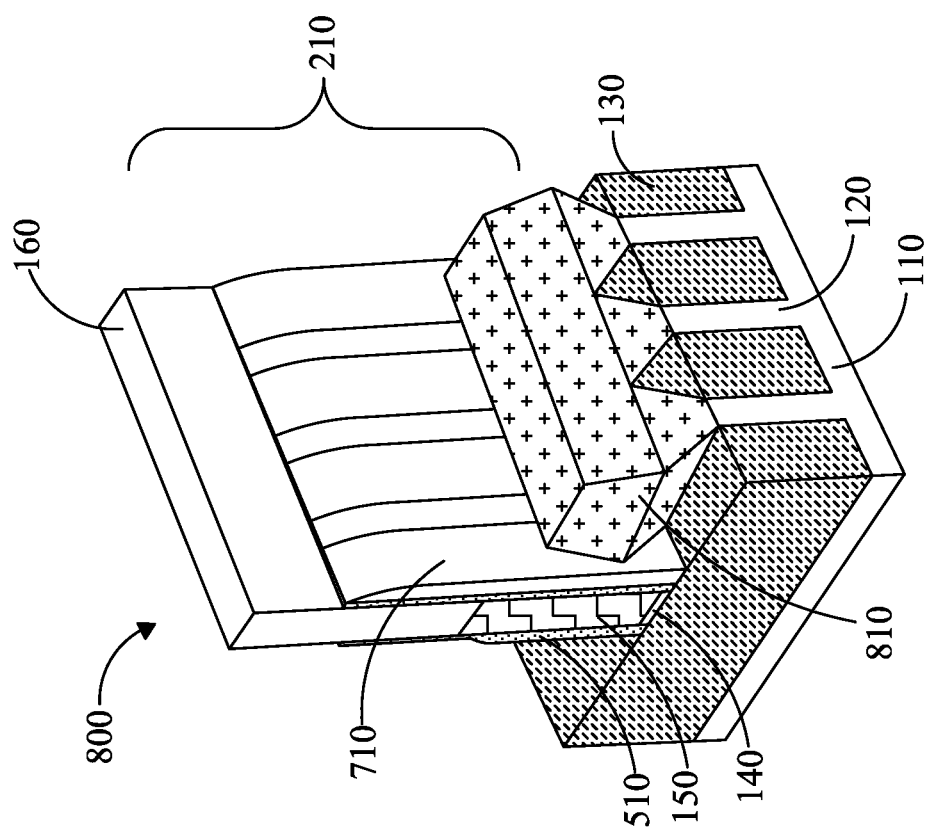
FIG. 8 illustrates a perspective view of a FinFET in accordance with an embodiment.

FIG. 8 illustrates a FinFET device 800 in accordance with an embodiment. FinFET device 800 comprises a semiconductor substrate 110, fins 120, an isolation structure 130, a gate dielectric layer 140, a gate electrode 150, a hard mask 160, a sealing layer 510, gate spacers 710, and source/drain regions 810. Instead of a single fin 120, this embodiment of the FinFET device 800 comprises three fins 120. Also, this embodiment includes epitaxially grown source/drain regions 810. The source/drain regions 810 may be formed by a SEG process and may be doped with p-type dopants or n-type dopants depending on the desired configuration of the FinFET device. The source/drain regions 810 may be doped either through an implantation method, or else by in-situ doping as the material is grown.

In another embodiment the source/drain regions 810 are formed so as to impart a strain on the channel region of the fin 120. In this embodiment, the source/drain regions 810 may then be grown to form a stressor that will impart a stress on the channel region of the fin 120 located underneath the gate structure 200. In an embodiment wherein the fin 120 comprises silicon, the source/drain regions 810 may then be formed through a SEG process with a material, such as silicon germanium, silicon carbon, or the like that has a different lattice constant than the silicon. The lattice mismatch between the stressor material in the source/drain regions 810 and the channel region of the fin 120 will impart a stress into the channel region that will increase the carrier mobility and the overall performance of the device. The source/drain regions 810 may be doped either through an implantation method, or else by in-situ doping as the material is grown.

Figure 9B:
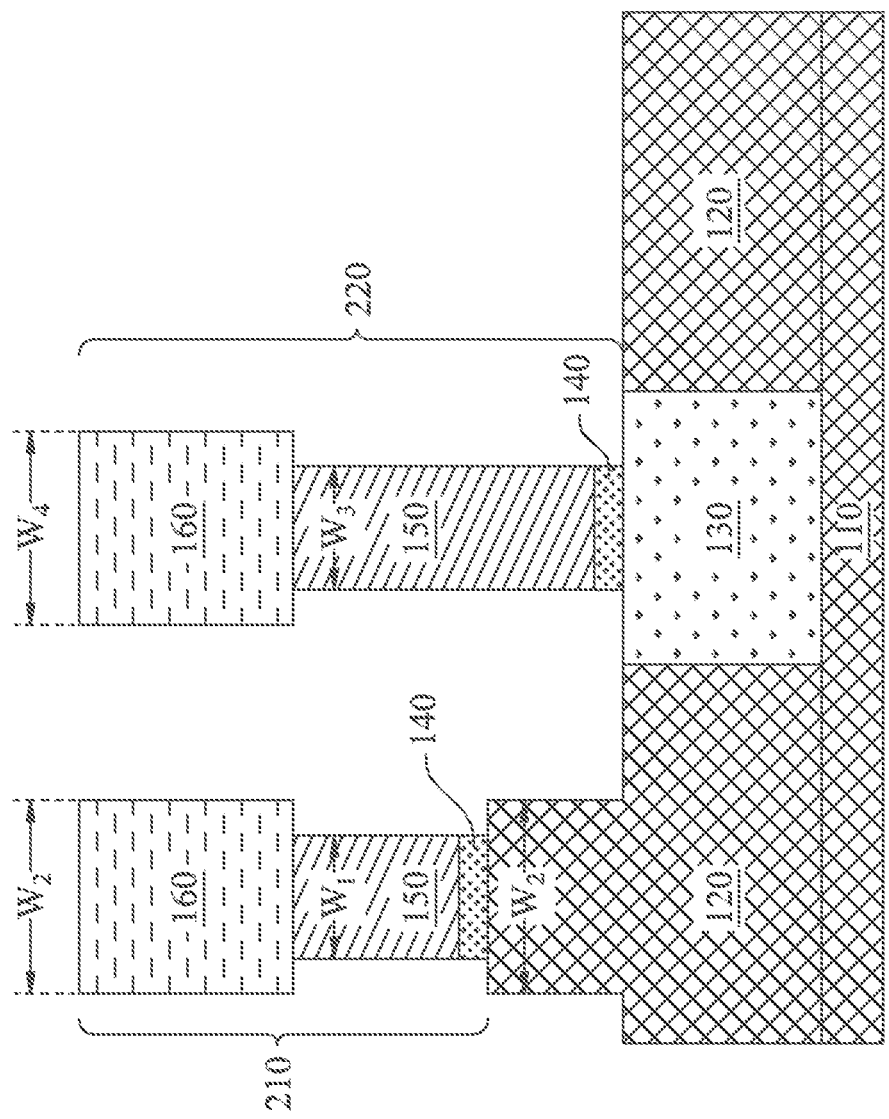

FIGS. 9A and 9B illustrate in perspective and cross-sectional views another embodiment at an intermediate stage of processing. This embodiment includes the gate structure 210 over a fin 120 and a dummy gate structure 220 over an isolation structure 130 between two fins 120. Only one dummy gate structure 220 and one gate structure 210 is shown for clarity. In practice, several dummy gate structure 220 and several gate structures 210 may be formed. In this embodiment, the two gate structures have had portions of their gate electrodes 150 sidewalls removed. The portion of the gate electrode 150 sidewalls may be removed using acceptable wet or dry etch techniques, such as by an anisotropic horizontal etch as previously described in reference to FIGS. 4A and 4B. Prior to the etch process of the gate electrode 150, the dummy gate structure 220 may have a width W4 between about 7 nm and about 1400 nm. In an embodiment, the width W4 of the dummy gate structure 220 and the width W2 of gate structure 210 may be the same prior to the etch processes of their respective gate electrodes 150. In an alternative embodiment, the widths W2 and W4 may be different. Similar to gate structure 210, the width of material removed from each side of gate electrode 150 of dummy gate structure 220 may range from about 3 nm to about 15 nm. In an alternative embodiment, only material from one sidewall of the gate electrode may be removed, leaving the other sidewall of the gate electrode substantially aligned with the respective sidewall of the hard mask 160. In some embodiments, the width of material removed from gate electrode 150 of dummy gate structure 220 may be between about 20% and about 40% of the gate width prior to removal. Stated another way, the width W3 may be between about 60% and about 80% of the width W4. The dummy gate structure 220 may continue through similar processing as gate structure 210 as discussed above in reference to FIGS. 5 through 7.

In this embodiment, the removal of portion of the gate electrode 150 and gate dielectric 140 of dummy gate structure 220 may allow for a better isolation between the dummy gate structure 220 and the fins 120 of the adjacent FinFET devices. The operation of the adjacent FinFET devices may be diminished if any part of the dummy gate structure 220 were to be in electrical connection with the fins 120 of the adjacent FinFET devices.

An embodiment is a method of forming a semiconductor structure, the method comprising forming a semiconductor fin on a substrate; forming a gate electrode of a first width over the semiconductor fin; forming a first dielectric layer of the first width over the gate electrode; and thinning the gate electrode to a second width, the second width less than the first width.

Another embodiment is a method of forming a semiconductor structure, the method comprising forming an isolation region on a substrate; forming a first gate electrode of a first width on the isolation region; forming a first dielectric layer of the first width over the first gate electrode, wherein the first dielectric layer is on a top surface of the first gate electrode; and etching the first gate electrode to a second width, the second width less than the first width.

A further embodiment is semiconductor device comprising a first semiconductor fin on a substrate; a first gate electrode, wherein the first gate electrode is on a top surface, and extending on sidewalls, of the first semiconductor fin, and the top surface of the semiconductor fin extends out from a side of the gate electrode between about 3 nm and about 15 nm from the side of the gate electrode; and a first dielectric layer on the gate electrode.

Although the present embodiments and their advantages have been described in detail, it should be understood that various changes, substitutions, and alterations can be made herein without departing from the spirit and scope of the disclosure as defined by the appended claims. For example, there are multiple methods for the deposition and removal of material as the structure is being formed. Any of these deposition or removal methods that achieve substantially the same result as the corresponding embodiments described herein may be utilized according to the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor structure, the method comprising:
   forming a semiconductor fin on a substrate, the semiconductor fin having a first longitudinal axis;
   forming a gate electrode of a first width over the semiconductor fin, portions of the semiconductor fin being exposed on opposing sides of the gate electrode of the first width, the first width being parallel to the first longitudinal axis;
   forming a first dielectric layer of the first width over the gate electrode; and
   thinning the gate electrode to a second width, the second width being parallel to the first width, the second width being less than the first width.

2. The method of claim 1, wherein thinning the gate electrode to a second width further comprises thinning a side of the gate electrode.

3. The method of claim 1, wherein thinning the gate electrode comprises an etching process, the etching process comprising:
   supplying a gas mixture selected from a group consisting essentially of CF4, CHF3, Ar, He, Cl2, HBr, O2, and combinations thereof, at a flow rate between about 30 standard cubic centimeters per minute (sccm) and about 150 sccm;
   maintaining a temperature between about 30° C. and about 80° C.;
   maintaining a pressure between about 3 milliTorr and about 10 milliTorr; and
   providing power between about 150 Watts and about 600 Watts.

4. The method of claim 1, wherein after the thinning of the gate electrode, a portion of the semiconductor fin extends outside the gate electrode.

5. The method of claim 1, wherein the forming the semiconductor fin comprises epitaxially growing the semiconductor fin.

6. The method of claim 1, wherein the second width is between 60% and 80% of the first width.

7. The method of claim 1 further comprising:
   forming a second dielectric layer over the semiconductor fin, wherein the second dielectric layer is between the semiconductor fin and the gate electrode; and
   after the thinning the gate electrode, removing a portion of the second dielectric layer, wherein the portion was exposed during the thinning of the gate electrode.

8. The method of claim 7, wherein the removing the portion of the second dielectric layer comprises an etching process, the etching process comprising:
   supplying a gas mixture selected from a group consisting essentially of BC13, C12, Ar, He, and combinations thereof, at a flow rate between about 30 sccm and about 200 sccm;
   maintaining a temperature between about 30° C. and about 80° C.;
   maintaining a pressure between about 3 milliTorr and about 20 milliTorr; and
   providing power between about 300 Watts and about 800 Watts.

9. A method of forming a semiconductor structure, the method comprising:
   forming an isolation region on a substrate;
   forming a first gate electrode of a first width on the isolation region, portions of the isolation region being exposed on opposing sides of the first gate electrode of the first width;
   forming a first dielectric layer of the first width over the first gate electrode, wherein the first dielectric layer is on a top surface of the first gate electrode;
   etching the first gate electrode to a second width, the second width being less than the first width, the second width being measured in a same direction as the first width;
   forming a second dielectric layer on the substrate and the isolation region, wherein the second dielectric layer is between the isolation region and the first gate electrode; and
   after the etching the first gate electrode, etching the second dielectric layer.

10. The method of claim 9, wherein the etching the first gate electrode further comprises etching using a gas mixture at a flow rate between about 30 sccm and about 150 sccm, a temperature between about 30° C. and about 80° C., a pressure between about 3 milliTorr and about 10 milliTorr, and a power between about 150 Watts and about 600 Watts.

11. The method of claim 10, wherein the gas mixture is selected from a group consisting essentially of $CF_4$, $CHF_3$, Ar, He, $Cl_2$, HBr, $O_2$, and combinations thereof.

12. The method of claim 9 further comprising:
   forming a first semiconductor fin on the substrate;
   forming a second semiconductor fin on the substrate, wherein the first and second semiconductor fins are collinear to each other, the first gate electrode being between the first and second semiconductor fin, and the first gate electrode being perpendicular to the first and second semiconductor fin;
   forming a second gate electrode over the first semiconductor fin, wherein the second gate electrode is parallel to the first gate electrode; and
   at a same time as etching the first gate electrode, etching the second gate electrode, wherein before the etching the second gate electrode, the second gate electrode has a third width, and after the etching the second gate electrode the second gate electrode has a fourth width, the fourth width less than the third width.

13. The method of claim 9, wherein the etching the second dielectric layer comprises:
   supplying a gas mixture selected from a group consisting essentially of BC13, C12, Ar, He, and combinations thereof, at a flow rate between about 30 sccm and about 200 sccm;
   maintaining a temperature between about 30° C. and about 80° C.;
   maintaining a pressure between about 3 milliTorr and about 20 milliTorr; and
   providing power between about 300 Watts and about 800 Watts.

14. A method of forming a fin field-effect transistor (FinFET) device, the method comprising:
   forming a semiconductor fin over a substrate;
   forming a gate electrode layer over the semiconductor fin;
   forming a hard mask layer on the gate electrode layer;
   patterning the hard mask layer, the gate electrode layer, and a first portion of the semiconductor fin to a first width; and thinning the gate electrode layer to have a second width, the second width being smaller than the first width.

15. The method of claim 14 further comprising forming an isolation region surrounding the semiconductor fin, the first portion of the semiconductor fin extending above a top surface of the isolation region.

16. The method of claim 14 further comprising:
   forming gate spacers on opposite sides of the patterned gate electrode layer; and
   forming source/drain regions on the patterned semiconductor fin, each of source/drain regions adjoining a sidewall of the first portion of the semiconductor fin.

17. The method of claim 14, wherein after thinning the gate electrode layer to have the second width, the first portion of the semiconductor fin extends out from a sidewall of the gate electrode.

18. The method of claim 14, wherein the thinning the gate electrode layer to have the second width further comprises selectively etching the gate electrode layer.

19. The method of claim 1, wherein forming the gate electrode of a first width over the semiconductor fin further comprises patterning the gate electrode and a first portion of the semiconductor fin to the first width.

* * * * *